United States Patent [19]

Hall et al.

[11] 4,352,449

[45] Oct. 5, 1982

[54] FABRICATION OF CIRCUIT PACKAGES

[75] Inventors: Peter M. Hall, Emmaus; Frank L. Howland, Allentown; Joseph M. Morabito, Bethlehem, all of Pa.; Lawrence J. Rickabaugh, North Andover, Mass.

[73] Assignee: Bell Telephone Laboratories, Incorporated, Murray Hill, N.J.

[21] Appl. No.: 107,327

[22] Filed: Dec. 26, 1979

[51] Int. Cl.³ .................... B23K 1/02; H01L 21/60
[52] U.S. Cl. .................... 228/123; 228/124; 228/180 A; 228/246
[58] Field of Search .............. 228/123, 124, 180 A, 228/188, 246

[56] References Cited

U.S. PATENT DOCUMENTS

| | | | |
|---|---|---|---|
| 3,292,240 | 12/1966 | McNutt et al. | 228/180 A X |
| 3,392,442 | 7/1968 | Napier et al. | 228/180 A X |
| 3,429,040 | 2/1969 | Miller | 228/180 A X |
| 3,436,818 | 4/1969 | Merrin et al. | 228/180 A X |
| 3,591,839 | 7/1971 | Evans | 228/180 A X |
| 3,609,471 | 9/1971 | Scace et al. | 228/124 X |
| 3,871,014 | 3/1975 | King et al. | 357/71 X |
| 4,143,385 | 3/1979 | Miyoshi | 357/68 X |

OTHER PUBLICATIONS

Settle, "A New Family of Microelectronic Packages for Avionics", *Solid State Technology*, Jun. 1978, pp. 54–58.
"Manufactoring Technology for Low Cost Hermetic Chip Carrier Packaging", Third Quarterly Report, Contract F33615-78-C-5147, Wright Patterson Air Force Base, Manufactoring Techology Div., Jul. 15, 1979, p. 1 of Appendix A.
Meiksin, *Thin and Thick Films for Hybrid Micro-electronics* Lexington Books, Toronto, 1976, pp. 320–321.

*Primary Examiner*—Kenneth J. Ramsey
*Attorney, Agent, or Firm*—Lester H. Birnbaum

[57] ABSTRACT

A method of fabricating circuit packages which employ macro-components (10) mounted on supporting substrates (20). In order to maintain sufficient clearance between the component and substrate and achieve high reliability bonds, massive solder preforms (16) are applied to contact pads on either the component or substrate. After contact pads of both carrier and substrate are brought into contact with the spheres, the bond is formed.

12 Claims, 7 Drawing Figures

FABRICATION OF CIRCUIT PACKAGES

BACKGROUND OF THE INVENTION

This invention relates to circuit packages employing macro-components such as chip carriers, and in particular to a method of bonding the component to a supporting substrate.

Packaging large scale integrated circuits utilizing hermetic ceramic chip carriers bonded to film circuits and printed circuit wiring boards is currently gaining increasing attention in the industry. Such packages enjoy many advantages over the standard dual-in-line (DIP) packages most often used for present packaging. For example, the chip carrier packages can be made smaller than DIP packages, and they are hermetic, testable, easily handled, and mechanically strong. Further, when there is a sufficient gap between the chip carrier and underlying substrate, interconnection wiring and film components can be placed under the carrier to conserve space. Other types of packages also require a sufficient gap between the macro-component and the underlying substrate. For example, certain packages employ thin or thick film resistor networks formed on a ceramic substrate which is in turn bonded to a supporting substrate including a thin or thick film circuit. Further, in many hybrid packages, a ceramic chip capacitor is also bonded to a supporting substrate including a thin or thick film circuit.

One problem associated with such packaging schemes involves the method used to bond the macro-component to the substrate. The usual practice is to solder bond by means of solder printing or dipping. This usually results in a lap joint less than 3 mils thick. This small gap between component and substrate makes it difficult to include film components on the area of the substrate underneath the bonded component. In particular, difficulties in cleaning and encapsulation of such areas arise with such a small gap distance. Further, the reliability of such solder joints is questionable due to intermetallic compounds which are formed as a result of the low ratio of solder to soluble metals in the contact pads. Finally, the lap joints tend to be mechanically stiff.

It is therefore a primary object of the invention to provide a circuit package with a strong and reliable bond between the macro-component and supporting substrate and with a sufficiently large gap between macro-component and substrate to include further components on the substrate thereunder.

SUMMARY OF THE INVENTION

This and other objects are achieved in accordance with the invention. The method according to the invention includes the steps of providing an electrical macro-component which includes a first set of contact pads, providing an insulating substrate which includes a second set of contact pads corresponding to the contact pads on the macro-component, and bonding the sets of contact pads by soldering. The soldering is accomplished by bonding large solder preforms onto one set of contact pads, bringing the other set of contact pads into contact with the preforms and then bonding while maintaining a gap between the carrier and substrate of at least 10 mils.

BRIEF DESCRIPTION OF THE DRAWING

These and other features of the invention will be delineated in detail in the following description. In the drawing.

It will be appreciated that for purposes of illustration, these figures are not necessarily drawn to scale.

DETAILED DESCRIPTION

Figure 1:
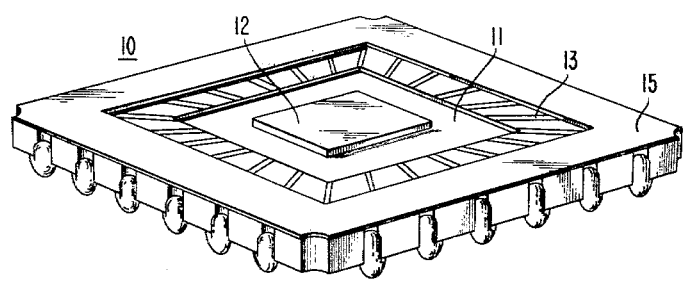
FIGS. 1 and 2 are a top and bottom perspective views, respectively, of a ceramic chip carrier with solder spheres applied in accordance with one embodiment of the invention.
Figure 2:
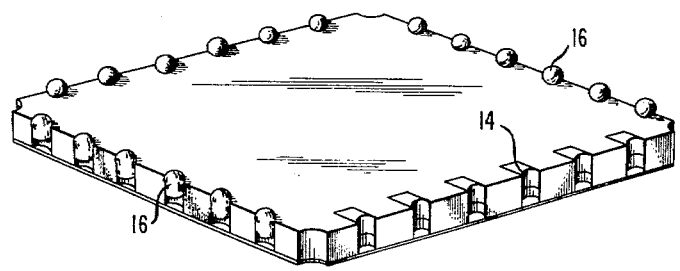

A typical chip carrier is illustrated in the views of FIGS. 1 and 2. It will be appreciated that the chip carrier shown is merely illustrative and any type of dielectric chip carrier or other electrical macro-component such as a film circuit or ceramic capacitor may be employed in accordance with the invention.

The carrier basically comprises a body, 10, which is a ceramic such as $Al_2O_3$ with a recess formed in the middle. On the bottom of the recess a layer of metal, 11, was deposited to serve as the contact pad for the underside of a silicon integrated circuit chip 12 (the details of which are not shown for the sake of simplicity). Deposited on a raised step around the area of the recess were contact pads 13, to which the contacts on the top surface of the chip were connected by wires (not shown). Each metal constituting the pad extended down a groove at the edge of the carrier to the underside of the carrier to form contact pads 14 on the bottom surface (see FIG. 2). The metal used to form the pads was a multilayer of tungsten-nickel-gold. Also included on the upper surface of the carrier was a layer of metal, 15, also comprising a multilayer of tungsten-nickel-gold which served as a bonding area for the hermetic cap (not shown). The gold layer of said pads provides a solder wettable layer.

The chip carrier typically had dimensions of 400 mils by 400 mils and a thickness of approximately 75 mils. The weight of the carrier including the cap and chip was approximately 800 mg. The size of the chip was typically approximately 146×143 mils with a thickness of approximately 20 mils and a weight of approximately 16 mg. Whereas the integrated circuit chip may be considered a micro-component, the chip carrier along with the various components included thereon constitute a relatively massive macro-component which, while easier to handle, presents special problems in bonding due to its large size and weight. (It should be understood that in the context of this application a macro-component is considered to be one with a size of at least 200×200 mils and a weight of at least 100 mg.)

Figure 3:
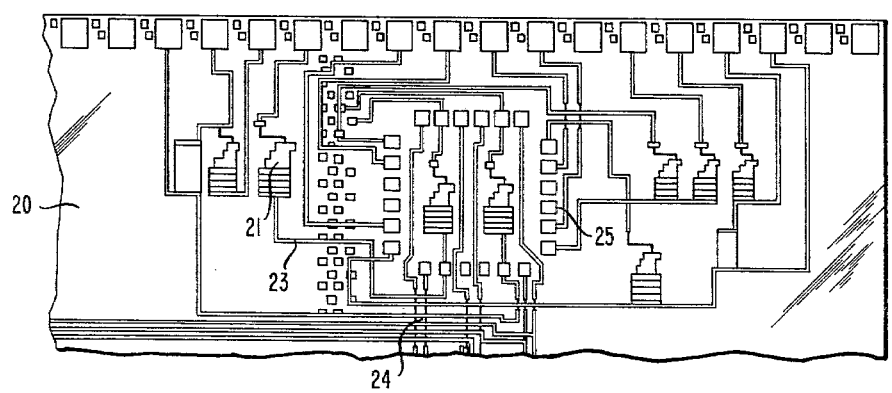
FIG. 3 is a top view of a portion of a supporting substrate with a thin film circuit formed thereon in accordance with one embodiment of the invention.

FIG. 3 is a plan view of a portion of a supporting substrate including a typical thin film circuit to which the carrier may be bonded. Again it will be realized that the circuit shown is illustrative only. The supporting substrate, 20, was Al$_2$O$_3$ with a thickness of approximately 28 mils. Formed thereon by standard techniques were thin film resistors such as 21, interconnecting leads such as 23, and thick film crossunders such as 24, which components are well known in the art and therefore will not be described in further detail. It will be noted, however, for the sake of comparison that typical thicknesses of thin film components are: resistor-0.1 $\mu$m; capacitor-0.5 $\mu$m; interconnecting leads-2 $\mu$m; and crossunder glaze-2 mils (50 $\mu$m). Also included on the substrate 20 was a second set of contact pads, 25, corresponding in number and layout to the first set of pads on the chip carrier. (It will be realized, of course, that typically not all pads on the substrate will be connected to the circuit and will be used for bonding purposes only. In addition, it is not necessary that all bonding pads on carrier or substrate be utilized in the bonding operation). The contact pads, 25, were fabricated by depositing a multilayer of titanium-palladium-gold by standard techniques to a total thickness of approximately 2 $\mu$m. The dimensions of each pad were approximately 20×50 mils. When this particular metal combination is utilized, it is desirable to heat treat the thin film circuit to obtain an alloy which has a slow dissolution rate in solder and thereby prevent formation of brittle intermetallics. A typical heat treatment was 350 degrees C. for one hour, although generally a range of 200–400 degrees for ½–10 hours would be useful. If desired, another metal system such as titanium-palladium-copper-nickel-gold may be employed in the thin film circuit, in which case the heat treatment is not needed.

It will be noted that the interconnecting leads, 23, have a width which is considerably less than that of the pads 25 (in this case, the conductor width was approximately 5 mils while the pads measured 20×50 mils). This provides a geometric solder stop to prevent flow of solder outside the area of the pads. If wide conductors are employed, it may be desirable to include solder dams around the pads. If the pads were made of thick film materials, for example, the solder dams could comprise the same glaze material used for the crossunder structures and therefore be screened on the circuit during the crossunder fabrication.

It should be appreciated that although the supporting substrate has been shown as a ceramic thin film circuit, other types of substrates can be utilized. For example, the substrate could be a printed wiring board or thick film circuit.

In accordance with a key feature of the invention, bonding of the carrier to the substrate including the thin film circuit is effected by utilizing solder preforms which in this example are in the shape of spheres. The spheres (16 of FIG. 2) may be applied to the contact pads of the chip carrier as shown or alternatively to the pads of the film circuit. Application to the chip carrier is presently considered the preferred embodiment since there is no interference with other components and there are no conductors between the pads 14 onto which the solder can creep.

In accordance with one example of the practice of the invention, after standard cleaning, a rosin-based flux was applied to the carrier pads, 14. The flux was a standard, commercially available flux such as those sold under the trade names Alpha 100 or Alpha 611 by Alpha Metals Inc. The flux allows the solder spheres to stick to the contact pads. The spheres were applied to the pads by dispensing either through a hopper or through a metal template positioned on the carrier. Another alternative is to form a photoresist mask on the carrier. After the spheres were positioned, the solder was reflowed by heating above the melting temperature for a time sufficient to bond the solder to the pads. In this case, using a solder composition of 60 percent by weight tin and 40 percent by weight lead, the structure was heated at a temperature of 220–240 degrees C. for approximately 10 seconds. It will be noted in FIG. 2 that some solder will flow down the grooves on the side of the chip carrier. However, the solder should essentially maintain its original shape. Following reflow, the flux was removed from the carrier by applying a standard solvent cleanser such as freon.

An alternative method of bonding the spheres to the carrier or substrate, which appears preferable for a commercial process, is to utilize a solid phase bonding technique. Such a technique is discussed in detail in U.S. Patent application of R. H. Minetti, Ser. No. 107,326 filed on an even date herewith and assigned to the present assignee, which application is incorporated by reference herein. Basically, the process involves applying the spheres to the contact pads while heating to a temperature just below the melting point of the solder and applying force to the spheres, which is typically approximately 5 lbs. per sphere. Bonding is therefore effected by solid state interdiffusion of solder and the pad metallization rather than reflowing. Thus, the need for fluxing, reflowing and cleaning steps may be eliminated.

Figure 4:
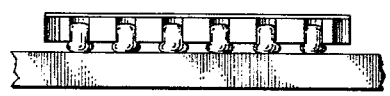
FIG. 4 is an end view showing the bonding of the chip carrier to the substrate in accordance with the same embodiment.

After the solder was bonded to the carrier, the carrier was bonded to the substrate. Again, a rosin-based flux was applied, this time to the contact pads, 25, on the substrate. (Alternatively, the flux may be applied to the solder on the carrier.) The carrier was positioned so that the solder bumps were in contact with corresponding contact pads on the substrate and the structure was heated to reflow the solder and form the bond. Again, heating was at a temperature of 220–240 degrees C. for approximately 10 seconds. FIG. 4 shows an end view of one such carrier bonded to the circuit of FIG. 3. (The components on the substrate are relatively thin and therefore not illustrated in this view.) It will be noted that a large gap was formed between the carrier and substrate. In this particular example, the gap was typically in excess of 12 mils, with the dimension depending on the diameter of the spheres, the size of the contact pads, and the weight of the carrier as explained in more detail below. In general, a gap of at least 10 mils is desirable to insure adequate encapsulation and proper cleaning under the carrier. Again, the solid phase bonding technique described in U.S. Patent application of R. H. Minetti may be used as an alternative to reflow bonding.

It will be realized that the size of the solder spheres is an important consideration in ensuring support of the macro-component at the appropriate height. The analysis is much more difficult than in the case of bonding micro-components such as integrated circuit chips since the weight of the component must be taken into account in the present case. Thus, in order to aid the skilled artisan in the practice of the invention, an analysis is presented of the relationship between solder sphere size, pad size, gap distance and weight of the macro-component.

Figure 5:
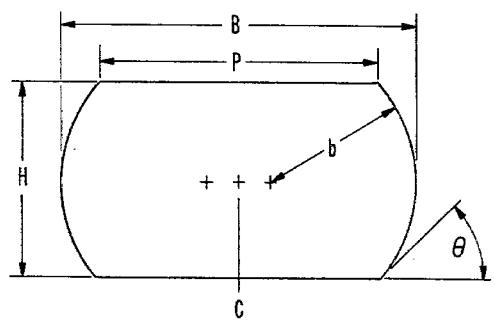
FIG. 5 is a cross-sectional representation of the approximate shape of a solder sphere after bonding in accordance with one embodiment of the invention.

FIG. 5 is a cross-sectional view of the approximate shape of a solder sphere after the chip carrier has been bonded to the supporting substrate. The sides are circular arcs of radius b with their center of curvature not coincident with the center of the shape C. The areas at the top and bottom of the solder are constrained by circular pads of diameter P. Solder pads are usually squares of rectangles, and so a rectangular pad of dimensions X×Y is considered to be a circle of equivalent area with an equivalent diameter of $$P = \left(\frac{4XY}{\pi}\right)^{\frac{1}{2}} \quad (1)$$

The contact areas of the solder will be constrained by the pads as shown as long as the weight of the macro-component is not so great as to cause the circular arc to become a complete semicircle. This condition is to be avoided to prevent bridging to nearby conductors, jumping solder dams or collapsing of the solder shape.

A small amount of solder flows away from the solder pad on the supporting substrate and can be ignored since it is only 1 percent of the volume of the sphere. The amount of solder which flows into the grooves on the side of the chip carrier, however, is more significant and should be taken into account. In this example, the volume of solder lost to the groove is approximately a half-cylinder of radius 8 mils, thus giving a volume of approximately 5000 mil$^3$.

In this analysis, the weight of the carrier is supported by the surface tension, S, of the solder which is assumed to be a known constant for a given solder alloy at its melting point. For the 60 percent tin −40 percent lead solder used here, the melting point is well-defined at 182 degrees C. If an oxide is allowed to form, the surface tension will drop to an indeterminate value. Hence, it is assumed that the flux is strong enough to prevent such oxide formation and the surface tension assumes its maximum value.

At equilibrium, the following relationship is true.

$$W = -S\frac{dA}{dH}, \quad (2)$$

where W is the weight of the macro-component being bonded, S is the surface tension of the solder, A is the free surface area of the solder and H is the height of the solder shape (i.e., the gap distance between the bonded component and the supporting substrate). It can be shown that the area, A, and volume, V, of the solder shape of FIG. 5 are given by the following expressions:

$$A = 4\pi b\left[\frac{H}{2} + \left(\frac{P}{2} - \sqrt{b^2 - \frac{H^2}{4}}\right)\sin^{-1}\left(\frac{H}{2b}\right)\right] \quad (3)$$

$$V = \pi H\left(\frac{P^2}{4} - \frac{H^2}{12} + b^2 - \frac{P}{2}\sqrt{b^2 - \frac{H^2}{4}}\right) + \quad (4)$$

$$2\pi b^2\left(\frac{P}{2} - \sqrt{b^2 - \frac{H^2}{4}}\right)\sin^{-1}\left(\frac{H}{2b}\right)$$

where P is the diameter of the pad and b is the radius of curvature in the plane shown in FIG. 5. Equation 4 is also equal to the volume of the original sphere ($\pi D^3/6$, where D is the diameter of the sphere).

Equation (3) depends on the assumption that the radius of curvature, b, in a vertical plane is the same all over the surface of the solder. This assumption is valid if the weight of the solder can be ignored. This approximation seems justified since a 20 mil diameter sphere weights 0.6 mg and a 40 mil diameter sphere weighs 5.0 mg, while the weight per pad of typical chip carriers is 20–50 mg.

Utilizing Maxwell's relations for thermodynamics, it can be shown that:

$$\left(\frac{\delta A}{\delta H}\right)_V = \left(\frac{\delta A}{\delta H}\right)_b - \left(\frac{\delta A}{\delta b}\right)_H \left(\frac{\delta V}{\delta H}\right)_b / \left(\frac{\delta V}{\delta b}\right)_H \quad (5)$$

and the derivatives from equations (3) and (4) are as follows:

$$\left(\frac{\delta A}{\delta H}\right)_b = \frac{\pi b}{\left(b^2 - \frac{H^2}{4}\right)^{\frac{1}{2}}}\left[P + H\sin^{-1}\left(\frac{H}{2b}\right)\right] \quad (6)$$

$$\left(\frac{\delta A}{\delta b}\right)_H = 4\pi H + \quad (7)$$

$$2\pi\left[P + \frac{H^2 - 8b^2}{2\left(b^2 - \frac{H^2}{4}\right)^{\frac{1}{2}}}\right]\sin^{-1}\left(\frac{H}{2b}\right) - $$

$$\frac{\pi PH}{\left(b^2 - \frac{H^2}{4}\right)^{\frac{1}{2}}}$$

$$\left(\frac{\delta V}{\delta H}\right)_b = \frac{\pi P^2}{4} - \frac{\pi H^2}{4} + \quad (8)$$

$$\frac{\pi}{\left(b^2 - \frac{H^2}{4}\right)^{\frac{1}{2}}}\left[\frac{H^2 P}{4} + \frac{Hb^2}{2}\sin^{-1}\left(\frac{H}{2b}\right)\right]$$

$$\left(\frac{\delta V}{\delta b}\right)_H = -\frac{\pi PbH}{\left(b^2 - \frac{H^2}{4}\right)^{\frac{1}{2}}} + 3\pi bH + \quad (9)$$

$$\pi\left[2Pb + \frac{bH^2 - 6b^3}{\left(b^2 - \frac{H^2}{4}\right)^{\frac{1}{2}}}\right]\sin^{-1}\left(\frac{H}{2b}\right).$$

As alluded to previously, if the weight of the bonded component is so great that the radius of curvature, b, approaches $H/2$, then the contact angle, $\theta$, approaches zero and the bond collapses. The critical (minimum) height $H_c$ can then be found from equation (4) and substituting therein the diameter D of the sphere to give:

$$H_c = -\frac{\pi P}{4} + [F + G^{\frac{1}{2}}]^{\frac{1}{3}} + [F - G^{\frac{1}{2}}]^{\frac{1}{3}} \quad (10)$$

-continued where $$F = \frac{D^3}{2} + \frac{\pi P^3}{64}(12 - \pi^2) \quad (11)$$

and $$G = F^2 + \frac{P^6}{8}\left(1 - \frac{\pi^2}{8}\right)^3. \quad (12)$$

The maximum weight which can be supported by a given sphere on a given pad is found by evaluating equations (5)–(9) in the limit as b goes to $H/2$, which gives:

$$W_c = \quad (13)$$

$$2SP\left[-\frac{\pi^2}{4} - \frac{\pi H_c}{P} + \frac{\pi(2P + \pi H_c)(P^2 + \pi H_c P + 2H_c^2)}{2H_c P(4P + \pi H_c)}\right].$$

Figure 6:
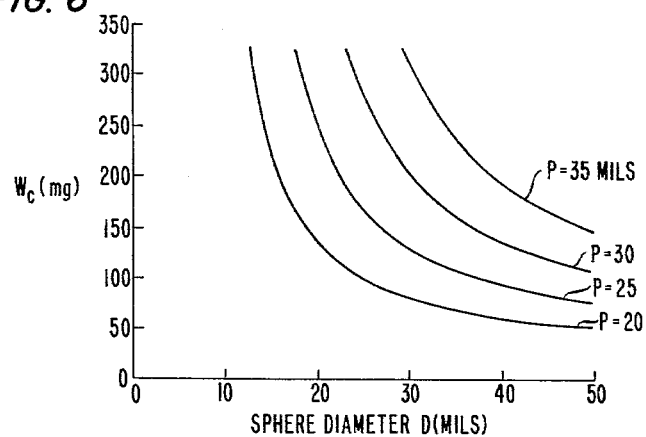
FIG. 6 is a graph of maximum weight supportable by solder spheres as a function of the diameter of the spheres in accordance with one embodiment of the invention.

FIG. 6 is a plot of $W_c$ as a function of D according to these equations assuming S=1.3 mg/mil. Thus, since the weight per pad of the macro-component and the pad diameter are known, the largest diameter sphere which could be utilized may be found from the graph of FIG. 6.

Figure 7:
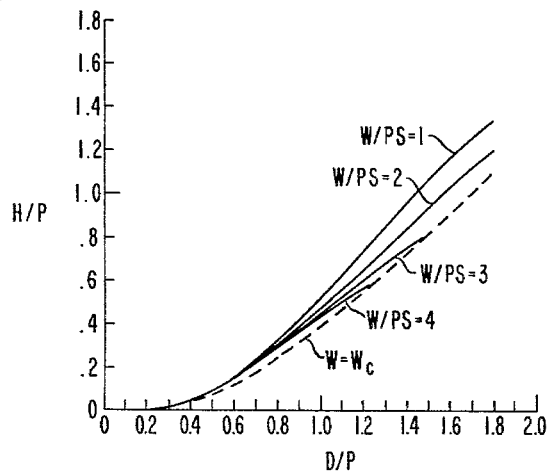
FIG. 7 is a graph of gap distance between the component and substrate as a function of the diameter of the spheres in accordance with one embodiment of the invention.

Values of the diameter below the maximum can be found by solving equation (4) numerically for b, and finding the derivatives given by equations (6)–(9) which are then used to solve equation (5). The solution is then substituted into equation (2) to give W as a function of H, D and P. For illustrative purposes, the calculation was made for selected values of P, H and D and the results plotted as shown in FIG. 7 in the form of height as a function of sphere diameter, both normalized by dividing by the pad diameter, for various value of W/PS.

In Table I below, specific parameters are given for the fabrication of a crosspoint switching circuit such as that shown in part in FIGS. 1–4. It will be realized that these parameters are exemplary and should not be taken as limiting the invention. It will be noted that the effective volume and effective sphere diameter take into account the amount of solder lost in the grooves (castellations) of the chip carrier. The bulge, B, and the contact angle, $\theta$, have also been calculated. It will be noted that there is satisfactory agreement between the measured height (H Exp) and the calculated height (H Calc) of the carrier.

TABLE I

|  | Empty | | With Chip And Lid | |
|---|---|---|---|---|
| Sphere Dia. (mil) | 32 | 40 | 32 | 40 |
| Solder Vol. × 10⁻³ (mil³) | 17.2 | 33.5 | 17.2 | 33.5 |
| Castellation Vol. × 10⁻³ (mil³) | 5 | 5 | 5 | 5 |
| Eff. Vol. × 10⁻³ (mil³) | 12.2 | 28.5 | 12.2 | 28.5 |
| D (Eff. Dia.) (mil) | 28.5 | 37.9 | 28.5 | 37.9 |
| Pad Size (mil) | 20 × 50 | 20 × 50 | 20 × 50 | 20 × 50 |
| Pad "dia." (mil), P | 35.7 | 35.7 | 35.7 | 35.7 |
| D/P | 0.80 | 1.06 | 0.80 | 1.06 |
| Weight/Pad (mg) | 22.9 | 22.9 | 33 | 33 |
| W/PS | 0.495 | .495 | 0.713 | 0.713 |
| Contact angle | 68° | 51° | 65° | 48° |
| Bulge (B) (mil) | 37.9 | 43.4 | 38.1 | 44.4 |
| H (Height) Calc. (mil) | 11.2 | 21.6 | 11.1 | 21.2 |
| H (Height) Exp. (mil) | 12 | 19 | — | — |

In preferred embodiments for general commercial production, it is expected that the sphere diameter will vary between 20 and 40 mils, the effective pad "diameter" will vary from 25–40 mils, and the weight of the carrier per pad will lie within the range 10–100 mg, thereby resulting in heights from 10–30 mils.

It should be realized that not all pads on the chip carrier need be soldered. This will result in an increase in the weight per pad. It was found, for example, that when solder was applied to only eight of the 24 pads in the package, the carrier was supported, whereas when only 4 of the pads were soldered, the solder pillars collapsed as predicted by the theory developed above.

It will also be realized that in certain packages it is desirable to bond the macro-component on both sides of the supporting substrate. When the component is suspended upside down from the underside of the substrate, it can be considered to have negative weight and the analysis previously presented will be applicable here as long as the solder is not stretched beyond a cylinder.

Since negative weight will tend to stretch the solder pillars, it may be desirable to increase the gap distance by adding additional weight to the carrier or remelting while the carrier is in a suspended state.

Although use of a particular composition of solder (60 percent tin-40 percent lead) has been described, it should be understood that the invention is not so limited. Other solders which may typically be employed include 95 percent lead-5 percent tin and 90 percent lead-10 percent tin. In general, it is desirable to choose an active solder with good mechanical properties, requiring no high temperature processes, and which is as wettable as possible.

It should also be noted that in addition to providing a large gap distance, the present invention also results in increased reliability as a result of the high solder-to-gold ratio which inhibits formation of intermetallic phases.

Various additional modifications will become apparent to those skilled in the art. All such variations which basically rely on the teachings through which the invention has advanced the art are properly considered within the spirit and scope of the invention.

We claim:

1. A method of fabricating a circuit package comprising the steps of providing an electrical macro-component (10 of FIG. 1) which includes a first set of contact pads (14) formed on one surface thereof, providing a supporting insulating substrate (20 of FIG. 3) which includes a second set of contact pads (25) formed on one surface thereof corresponding to the first set of contact pads on the macro-component, and bonding the macro-component to the substrate by soldering said sets of contact pads together, characterized in that said pads include a solder wettable layer of gold thereon, and said soldering is done by bonding large lead-tin solder preforms (16) onto one of said sets of contact pads, bringing the other set of contact pads into contact with the preforms, and bonding the preforms to the said other set of contact pads so that the weight of the macro-component is supported by the solder preforms while maintaining a gap between the macro-component and the substrate of at least 10 mils.

2. A method of fabricating a hybrid integrated circuit package comprising the steps of providing a dielectric chip carrier (10) including a semiconductor integrated circuit chip (12) mounted thereon, a hermetic seal, and a first set of contact pads (14) formed on the surface of the carrier opposite to that of the chip, the combined weight of the component being at least 100 mg, providing a supporting insulating substrate (20) which includes on one surface thereof a second set of contact pads (25) corresponding to the contact pads on the carrier, and bonding said carrier to said substrate by soldering said sets of contact pads together, characterized in that said substrate also includes a film circuit (21, 23, 24) on the same surface as the contact pads with at least some components lying in the area over which the chip carrier is mounted to the substrate; said pads include a solder wettable layer of gold thereon; and the soldering is done by: bonding lead-tin solder spheres (16) onto one set of contact pads, the spheres having a diameter within the range 20–40 mils; bringing the spheres into contact with the other set of contact pads; and heating the structure to at least the melting point of the solder to reflow the solder and thereby establish a bond while the weight of the macro-component is supported by the solder spheres to produce a gap height of at least 10 mils.

3. The method according to claim 1 wherein the macro-component comprises a ceramic chip carrier.

4. The method according to claim 1 wherein the supporting substrate further includes a film circuit formed thereon.

5. The method according to claim 1 wherein the preforms are spheres with a diameter which lies within the range 20–40 mils.

6. The method according to claim 5 or 2 wherein the diameter of the spheres is less than or equal to that value which satisfies the relationships:

$$H_c = -\frac{\pi P}{4} + [F + G^{\frac{1}{2}}]^{\frac{1}{3}} + [F + G^{\frac{1}{2}}]^{\frac{1}{3}} \text{ and}$$

$$W_c = 2SP - \frac{\pi^2}{4} - \frac{\pi H_c}{P} + \frac{\pi(2P + \pi H_c)(P^2 + \pi H_c P + 2H_c^2)}{2H_c P(4P + \pi H_c)}$$

where $$F = \frac{D^3}{2} + \frac{\pi P^3}{64}(12 - \pi^2);$$

$$G = F^2 + \frac{P^6}{8}\left(1 - \frac{\pi^2}{8}\right)^3;$$

D is the diameter of the sphere; P is the equivalent diameter of the contact pads; $W_c$ is the weight per pad of the macro-component; $H_c$ is the gap distance between the macro-component and the substrate and S is the surface tension of the solder.

7. The method according to claim 1 wherein the preforms are bonded to one set of contact pads by applying a flux to said contact pads, placing the preforms on the pads, and reflowing the solder by heating to a temperature at least as great as the melting point of the solder.

8. The method according to claim 1 wherein the preforms are bonded to the said other set of contact pads by heating at a temperature at least as great as the melting point of the solder.

9. The method according to claim 1 wherein the solder comprises a mixture of 60% tin and 40% lead.

10. The method according to claim 1 wherein the contact pads on the supporting substrate comprise successive layers of titanium, palladium and gold.

11. The method according to claim 1 wherein the contact pads on the macro-component comprise successive layers of tungsten, nickel and gold.

12. A method of fabricating a circuit package comprising the steps of providing an electrical macro-component (10 of FIG. 1) which includes a first set of contact pads (14) formed on one surface thereof, providing a supporting insulating substrate (20 of FIG. 3) which includes a second set of contact pads (25) formed on one surface thereof corresponding to the first set of contact pads on the macro-component, and bonding the macro-component to the substrate by soldering said sets of contact pads together, characterized in that said soldering is done by bonding large solder preforms (15) onto one of said sets of contact pads, bringing the other set of contact pads into contact with the preforms, and bonding the preforms to the said other set of contact pads while the macro-component is mounted on the bottom surface of the substrate so that the solder preforms are stretched by the weight of the component resulting in a gap between the macro-component and the substrate of at least 10 mils.

* * * * *

UNITED STATES PATENT AND TRADEMARK OFFICE
CERTIFICATE OF CORRECTION

PATENT NO. : 4,352,449
DATED : October 5, 1982
INVENTOR(S) : Peter M. Hall, Frank L. Howland, Joseph M. Morabito, and Lawrence J. Rickabaugh It is certified that error appears in the above—identified patent and that said Letters Patent is hereby corrected as shown below:

Column 6, line 10, "weights" should read --weighs--. Column 9, line 47, "$[F + G]^{1/2}{}^{1/3} + [F + G]^{1/2}{}^{1/3}$" should read --$[F + G]^{1/2}{}^{1/3} + [F - G]^{1/2}{}^{1/3}$--. Column 10, line 44, "(15)" should read --(16)--.

Signed and Sealed this

Twenty-second Day of February 1983

[SEAL]

Attest:

*Attesting Officer*

GERALD J. MOSSINGHOFF

*Commissioner of Patents and Trademarks*